US012750973B2

(12) United States Patent
Clark et al.

(10) Patent No.: US 12,750,973 B2
(45) Date of Patent: Sep. 29, 2026

(54) IMMERSION COLD PLATES WITH IMPINGEMENT

(71) Applicant: Dell Products L.P., Round Rock, TX (US)

(72) Inventors: Emily Clark, Round Rock, TX (US); Timothy Shedd, Lithia, FL (US)

(73) Assignee: Dell Products L.P., Round Rock, TX (US)

( * ) Notice: Subject to any disclaimer, the term of this patent is extended or adjusted under 35 U.S.C. 154(b) by 279 days.

(21) Appl. No.: 18/654,516

(22) Filed: May 3, 2024

(65) Prior Publication Data

US 2024/0341058 A1 Oct. 10, 2024

Related U.S. Application Data

(63) Continuation-in-part of application No. 18/296,694, filed on Apr. 6, 2023, now Pat. No. 12,317,445.

(51) Int. Cl.
*H05K 7/20* (2006.01)

(52) U.S. Cl.
CPC ................................ *H05K 7/20254* (2013.01)

(58) Field of Classification Search
CPC .................................................. H05K 7/20254
See application file for complete search history.

(56) References Cited

U.S. PATENT DOCUMENTS 5,016,090 A * 5/1991 Galyon ............... H10W 40/776 257/714
9,414,525 B2 * 8/2016 Campbell .......... H05K 7/20772
11,483,947 B2 * 10/2022 Whitmore .......... H05K 7/20345
2009/0260777 A1 * 10/2009 Attlesey ..................... G06F 1/20 165/104.33
2010/0103620 A1 * 4/2010 Campbell .......... H05K 7/20772 361/702
2019/0204883 A1 7/2019 Chu et al.
2022/0026965 A1 1/2022 Chen et al.
2022/0142013 A1 * 5/2022 Zhou ......................... F28F 3/12 361/702

* cited by examiner

*Primary Examiner* — Mukundbhai G Patel
(74) *Attorney, Agent, or Firm* — Fogarty LLP

(57) ABSTRACT

Immersion cold plates with impingement are described. In some embodiments, a cold plate may include: a base having fins disposed in parallel; a cover having a cavity configured to house the fins, where the cover is configured to allow a liquid to flow from an inlet to an outlet along the base and between the fins; and an impingement plate disposed between the base and the cover.

14 Claims, 4 Drawing Sheets

IMMERSION COLD PLATES WITH IMPINGEMENT

FIELD

This disclosure relates generally to Information Handling Systems (IHSs), and more specifically, to immersion cold plates with impingement for IHSs.

BACKGROUND

As the value and use of information continues to increase, individuals and businesses seek additional ways to process and store it. One option available to users is an Information Handling System (IHS). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use, such as financial transaction processing, airline reservations, enterprise data storage, or global communications. In addition, IHSs may include a variety of hardware and software components that may be configured to process, store, and communicate information and may include one or more computer systems, data storage systems, and networking systems.

SUMMARY

Systems and methods for immersion cold plates with impingement are described. In an illustrative, non-limiting embodiment, a cold plate may include: a base having fins disposed in parallel; a cover having a cavity configured to house the fins, where the cover is configured to allow a liquid to flow from an inlet to an outlet along the base and between the fins; and an impingement plate disposed between the base and the cover.

In some cases, the inlet may have a circular cross section, and the outlet may have a rectangular cross section. The impingement plate may be configured to distribute portions of the liquid from the inlet to different areas of the base before the portions of the liquid make any physical contact with any of the fins.

The impingement plate may include holes configured to distribute the liquid among the fins. The holes may be disposed along rows perpendicular with respect to the fins. Along a given row, each of a plurality of holes is disposed between two adjacent fins.

In some cases, a spacing between fins near at the inlet may be greater than a spacing between fins near the outlet. Additionally, or alternatively, a width of a fin near at the inlet may be greater than a width of the fin near the outlet. Additionally, or alternatively, a spacing between fins near the inlet may be smaller than a spacing between fins near the outlet. Additionally, or alternatively, a width of a fin at the inlet may be smaller than a width of the fin at the outlet.

The base may be configured to be coupled to one or more Information Handling System (IHS) components. The one or more IHS components may include at least one of: a Central Processing Unit (CPU), a Graphical Processing Unit (GPU), an audio Digital Signal Processor (aDSP), a Neural Processing Unit (NPU), a Tensor Processing Unit (TSU), a Neural Network Processor (NNP), an Intelligence Processing Unit (IPU), an Image Signal Processor (ISP), or a Video Processing Unit (VPU).

At least one of: a spacing between fins, a width of each fin, and/or the height of each fin, are selected to increase a heat exchange operation adjacent to a hot spot of the one or more IHS components. In some cases, a density of holes on the impingement plate may also be selected, at least in part, to increase a heat exchange operation adjacent to a hot spot of the one or more IHS components.

In another illustrative, non-limiting embodiment, an IHS may include: a component; and a cold plate coupled to the component, the cold plate comprising: a base having fins disposed in parallel; a cover having a cavity configured to house the fins, where the cover comprises an inlet and an outlet, and where the cover is configured to allow a liquid to flow from the inlet to the outlet along the base and between the fins; and an impingement plate disposed between the base and the cover.

The impingement plate may be configured to distribute portions of the liquid from the inlet to different areas of the base without the portions of the liquid making any physical contact with any of the fins. In some implementations, the impingement plate may include holes configured to distribute the liquid among the fins, where the holes are disposed along rows perpendicular with respect to the fins, and where along a given row, each of a plurality of holes is disposed between two adjacent fins.

In another illustrative, non-limiting embodiment, a method may include: receiving an IHS and coupling a cold plate to the IHS, the cold plate including: a base having fins disposed in parallel; a cover having a cavity configured to house the fins, where the cover is configured to allow a liquid to flow from an inlet to an outlet along the base and between the fins; and an impingement plate disposed between the base and the cover. The method may also include immersing at least a portion of the IHS and the cold plate in the cooling liquid.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price.

An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

In modern IHS designs, system integration continues to drive greater component density such that heat dissipation problems have become even more challenging. When traditional fan cooling cannot meet an IHS's demand for heat dissipation, liquid cooling may be an adequate alternative. Conventionally, two main types of liquid cooling have been developed, namely liquid immersion cooling, and Direct Contact Liquid Cooling (DCLC).

Liquid immersion cooling refers to a technique in which components and other electronics, including complete IHS, are submerged in a thermally conductive dielectric liquid or coolant. Heat is removed from the system by circulating a dielectric liquid in direct contact with heat generating components, followed by cooling of the heated dielectric liquid using heat exchangers. Liquids suitable for liquid immersion cooling should have relatively good electrical insulating properties to ensure that they can safely meet the operational requirements of energized electronic components.

In contrast, the DCLC approach uses the thermal conductivity of liquid to provide dense, concentrated cooling to specific surface areas of an IHS. Direct liquid cooling also uses cold plates attached to components along with relatively high flow rates to pull heat away from IHS components.

Figure 1:
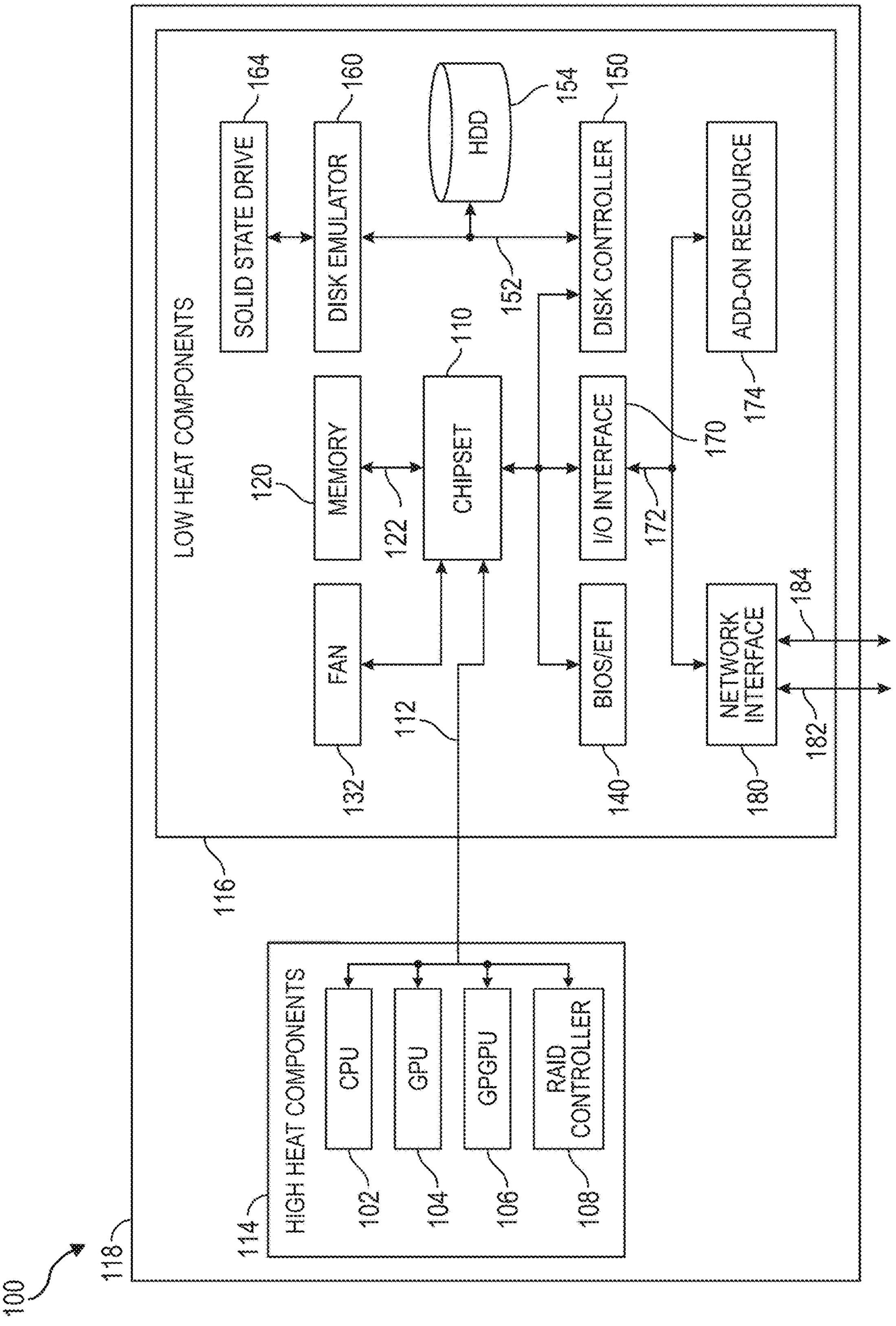
FIG. 1 is a diagram illustrating example components of an Information Handling System (IHS), according to some embodiments.

In that regard, FIG. 1 illustrates an example IHS 100 that may be implemented according to one embodiment of the present disclosure. In some implementations, IHS 100 may include any IHS, such as a rack-mount server, a blade server, bare metal computing device, or any other device that processes instructions stored in a memory. Although in this implementation entire IHS 100 may be immersed in a liquid coolant (e.g., submerged in a tank), in other cases, only a portion of the IHS may be immersed.

As shown, IHS 100 includes chassis 118 for removably receiving and securing components in a generally fixed physical arrangement relative to one another. IHS 100 includes one or more CPUs 102, chipset 110, memory 120, Basic Input and Output System/Extensible Firmware Interface (BIOS/EFI) module 140, disk controller 150, disk emulator 160, Input/Output (I/O) interface 170, and network interface 180. Memory 120 is connected to chipset 110 via memory bus 122.

In a particular embodiment, IHS 100 may include separate memories that are dedicated to each of multiple central processing units 102 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

In some cases, IHS 100 may also include fan 132 that may be coupled to and controlled by chipset 110 for moving liquid coolant. In some cases, by implementing systems and methods described herein, fan 132 may be operated at lower speeds. In various implementations, fan 132 may be replace with a pump and/or be part of the immersion tank were IHS 100 is deployed, as opposed to it being part of IHS 100 itself.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 140 includes BIOS/EFI code operable to, among other things, detect resources within IHS 100, to provide drivers for the resources, initialize the resources, and access the resources.

Disk controller 150 may include disk interface 152 that connects disc controller 150 to hard disk drive (HDD) 154 and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or any combination thereof.

Disk emulator 160 may permit a solid-state drive 164 to be connected to IHS 100. An example of external interface 162 includes a USB interface, an IEEE 1194 (Firewire) interface, a proprietary interface, or a combination thereof. Alternatively, solid-state drive 164 can be disposed within IHS 100.

I/O interface 170 may include peripheral interface 172 that connects the I/O interface to add-on resource 174 and to network interface 180. Peripheral interface 172 may be the same type of interface as I/O channel 112 or a different type of interface. As such, I/O interface 170 extends the capacity of I/O channel 112 when peripheral interface 172 and I/O channel 112 are of the same type, and I/O interface 170 translates information from a format suitable to I/O channel 112 to a format suitable to peripheral channel 172 when they are of a different type.

Add-on resource 174 can include a data storage system, an additional graphics interface, a Network Interface Card (NIC), a sound/video processing card, another add-on resource, or a combination thereof. Add-on resource 174 may be on a main circuit board, on separate circuit board or add-in card disposed within IHS 100, a device that is external to the information handling system, or a combination thereof.

Network interface 180 represents a NIC disposed within IHS 100 on a main circuit board of IHS 100, integrated onto another component such as chipset 110, in another suitable location, or a combination thereof. Network interface device 180 includes network channels 182 and 184 that provide interfaces to devices that are external to IHS 100.

In a particular embodiment, network channels 182 and 184 may be of a different type than peripheral channel 172 and network interface 180 translates information from a format suitable to the peripheral channel to a format suitable to external devices. An example of network channels 182 and 184 includes InfiniBand channels, Fiber Channel channels, Gigabit Ethernet channels, proprietary channel architectures, or a combination thereof. Network channels 182 and 184 may be connected to external network resources (not illustrated). The network resource can include another IHS, a data storage system, another network, a grid management system, another suitable resource, or a combination thereof.

In some cases, components of IHS 100 may be categorized as high heat producing components ("high heat components") 114 and low heat producing components ("low heat components") 116. In this example, CPU 102, Graphics Processing Unit (GPU) 104, General Purpose Computing on Graphics Processing Unit (GPGPU) 106, and RAID controller 108 are high heat components 114 because they produce more heat during operation than low generating components 116, which include: memory 120, disk emulator 160, hard disk drive 154, disk controller 150, BIOS/EFI 140, I/O interface 170, network interface 180, and add-on resource 174).

In various embodiments, systems and methods described herein may include coupling at least one cold plate to one or more IHS components (e.g., CPU 102, GPU 104, GPGPU 106, RAID controller 108, chipset 110, etc.) in liquid cooled segment 114. While traditional cold plate designs require hardening efforts to prevent leaks, various embodiments described herein are specifically designed to operate with an immersion fluid in an immersion tank, and therefore do not have such a requirement.

A cold plate is a heat exchanger that transfers the heat generated by an IHS component (CPUs, GPUs, chipsets, RAM modules, etc.) to a fluid medium, a liquid coolant, where the heat is dissipated, thereby allowing regulation of the component's temperature. In other implementations, cold plates may be used with other high-power semiconductor devices such as power transistors and optoelectronics (e.g., lasers and light-emitting diodes or "LEDs").

As processors' Thermal Design Power or "TDPs" (a measure of the maximum amount of heat the processor can dissipate under normal operating conditions) continue to rise, cold plates are expected to extend the capabilities of liquid cooled IHSs. Moreover, in various liquid immersion applications, a cold plate may be used to implement forced convention cooling techniques.

In some embodiments, a cold plate may use a wide fin pitch to accommodate higher viscosity fluids used in immersion cooling. Additionally, or alternatively, a cold plate may include an impingement mechanism for distributing cool liquid across the top surface of an IHS component.

Figure 2:
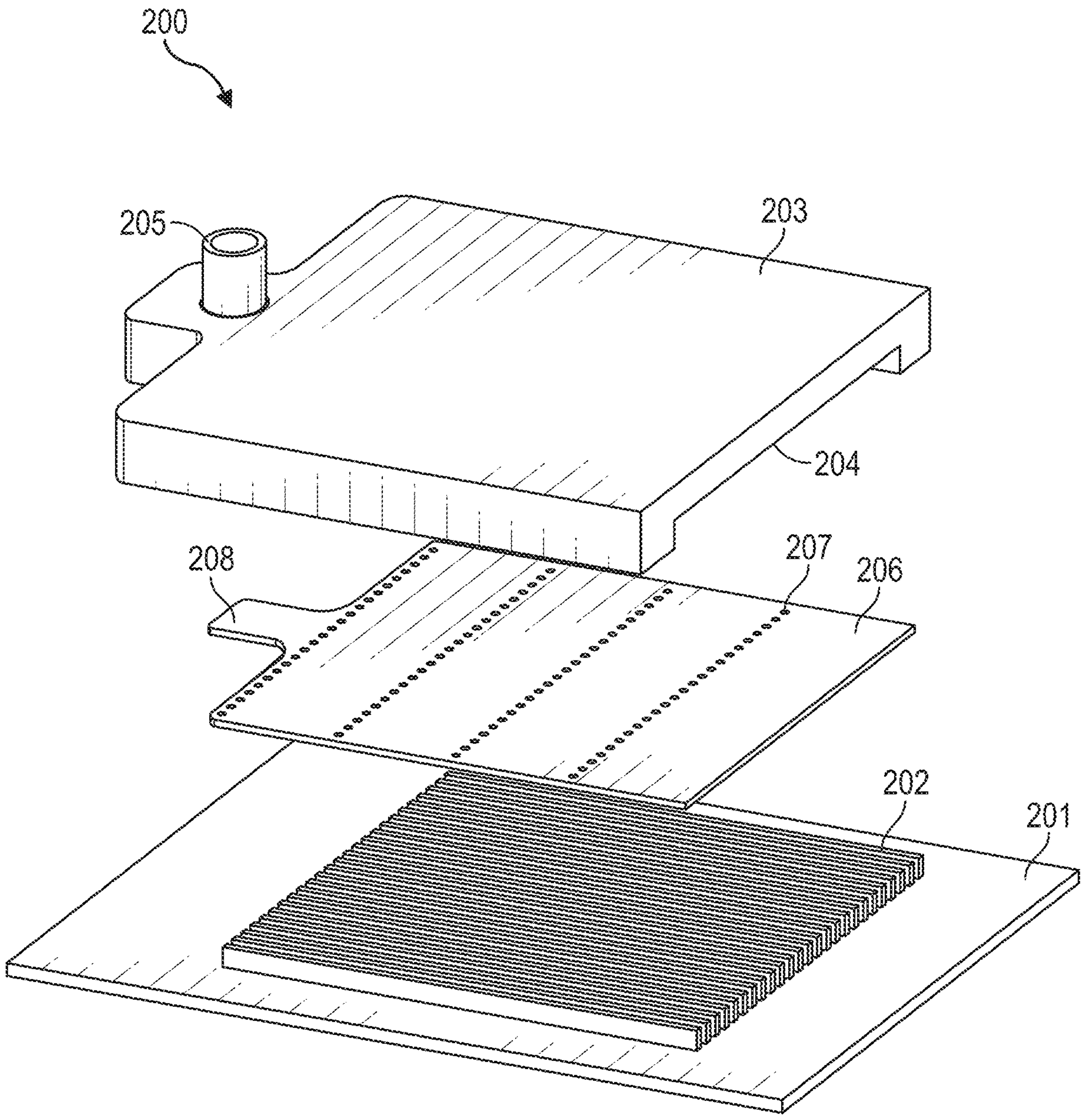
FIG. 2 is a diagram illustrating an exploded view of an example of an immersion cold plate with impingement, according to some embodiments.
Figure 3:
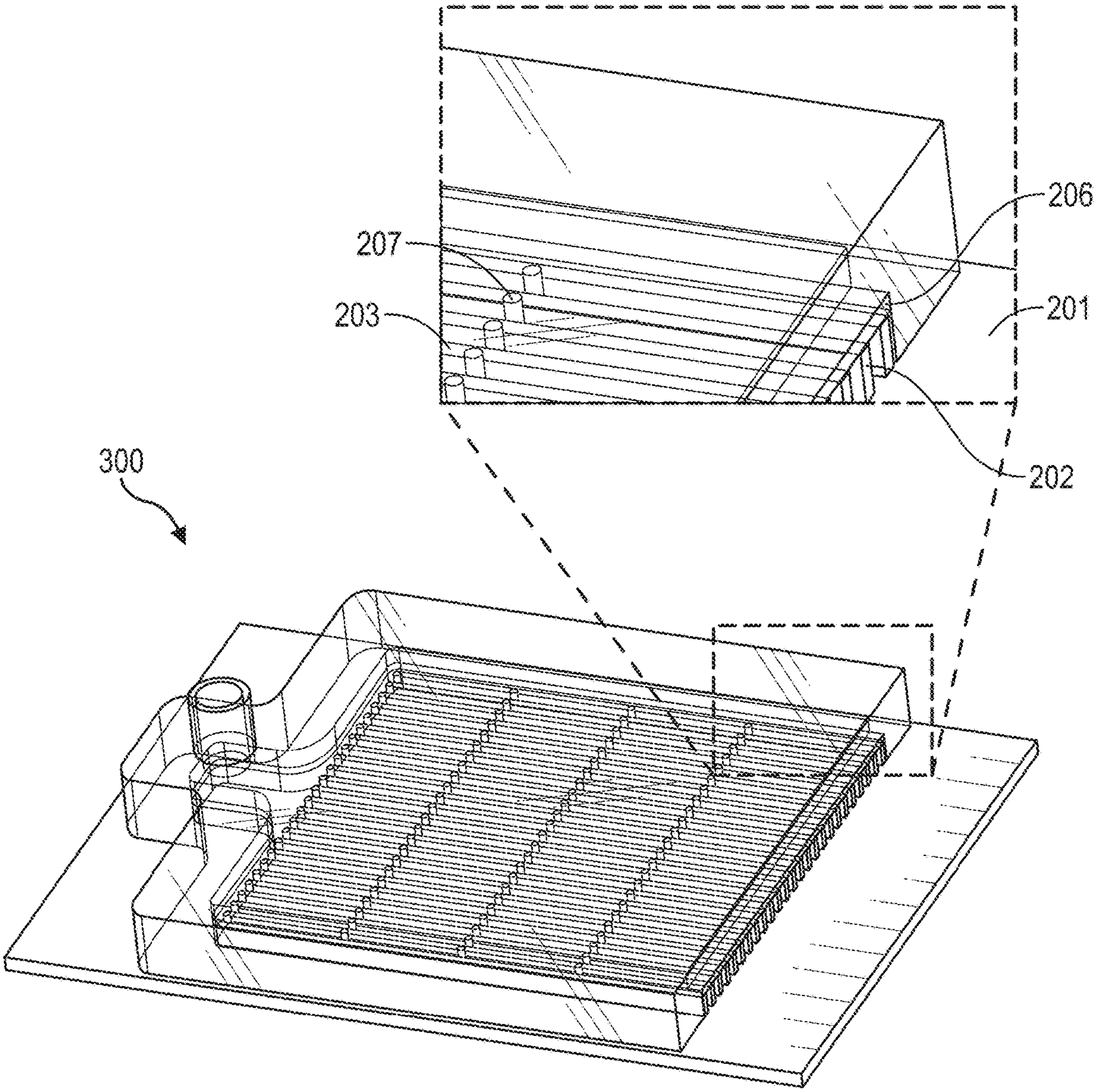
FIG. 3 is a diagram illustrating an isometric view of an example of an immersion cold plate with impingement, according to some embodiments.

FIG. 2 illustrates exploded view 200 and FIG. 3 shows isometric view 300 of an example of an immersion cold plate with impingement. Particularly, the cold plate includes base 201, cap or cover 203, and impingement plate 206. The underside of base 201 may be coupled to an IHS component, for example using thermal tape, adhesive, fasteners, etc.

Cover 203 includes inlet 205 (e.g., with a circular cross section) configured to receive a cooling liquid and outlet 204 (e.g., with a rectangular cross section) configured to release the cooling liquid (e.g., into in liquid cooled segment 114, an immersion tank, etc.) after a heat exchange operation with the IHS component.

Base 201 includes a plurality of fins 202 disposed in a parallel configuration and aligned with the liquid flow between inlet 205 and outlet 204. Cover 203 includes a cavity configured to house fins 202, such that the cooling liquid travels from inlet 205 to outlet 204 along base 201 and between fins 202. Fins 202 may have a width and fin pitch (i.e., the spacing between adjacent fins) with dimensions commensurate with the cooling liquid's properties (e.g., viscosity).

In some implementations, the number of fins 202, the spacing between fins 202, the width of each fin 202, and/or the height of each fin 202 maybe account for a hot spot of the IHS component, to maximize heat exchange on a portion of base 201 adjacent to the hot spot.

In some cases, the spacing between fins 202 near inlet 205 may be greater than the spacing between fins 202 near outlet 204. Additionally, or alternatively, the width of each fin 202 near inlet 205 may be greater than the width of each fin 202 near outlet 204.

In other cases, the spacing between fins 202 near inlet 205 may be smaller than the spacing between fins 202 near outlet 204. Additionally, or alternatively, the width of each fin 202 near inlet 205 may be smaller than the width of each fin 202 near outlet 204.

Impingement plate 206 may be configured to distribute portions of the cooling liquid from inlet 205 to different areas of base 201, fins 202, and/or channels between adjacent fins, before the liquid makes any physical contact with any of fins 202. In some cases, impingement plate 206 may have a geometry configured to match the geometry of the cavity of cover 203, including inlet cover portion 208 disposed under inlet 205. Impingement plate 201 includes holes 207 configured to allow the cooling liquid to flow from an upper portion of the cavity to a lower portion of the cavity where fins 202 are.

In this implementation, holes 207 are disposed along rows perpendicular with respect to fins 202. Along a given row, each of a plurality of holes is disposed above a channel between two adjacent fins. In other implementations, however, different openings and/or patterns may be used. For example, the number and diameter of holes 207, the spacing between rows, and openings of different geometries may be used depending upon a heat map, hot spot, and/or temperature profile at the surface of the IHS component.

For example, the density of holes 207 on impingement plate 206 directing liquid flow may be selected, at least in part, to account for a hot spot of the IHS component, to maximize heat exchange on a portion of base 201 adjacent to the hot spot.

Figure 4:
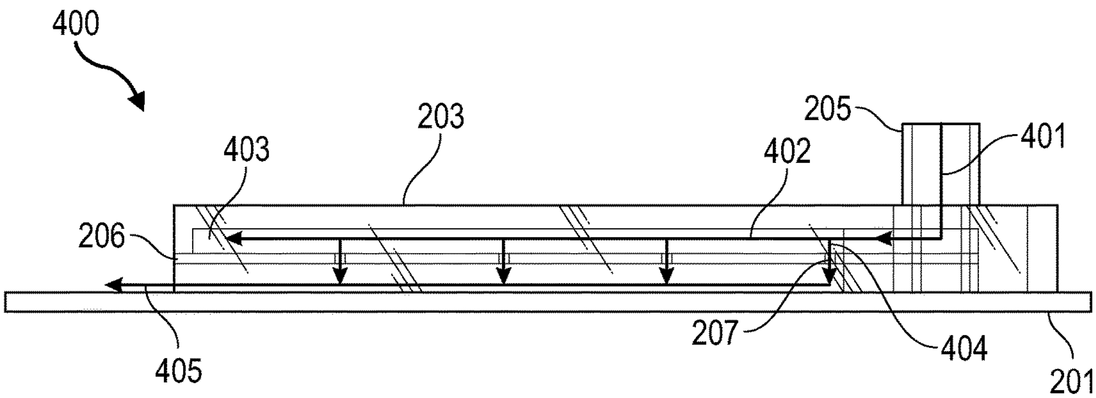
FIG. 4 is a diagram illustrating a cross section of an example of an immersion cold plate with impingement, according to some embodiments.
Figure 5:
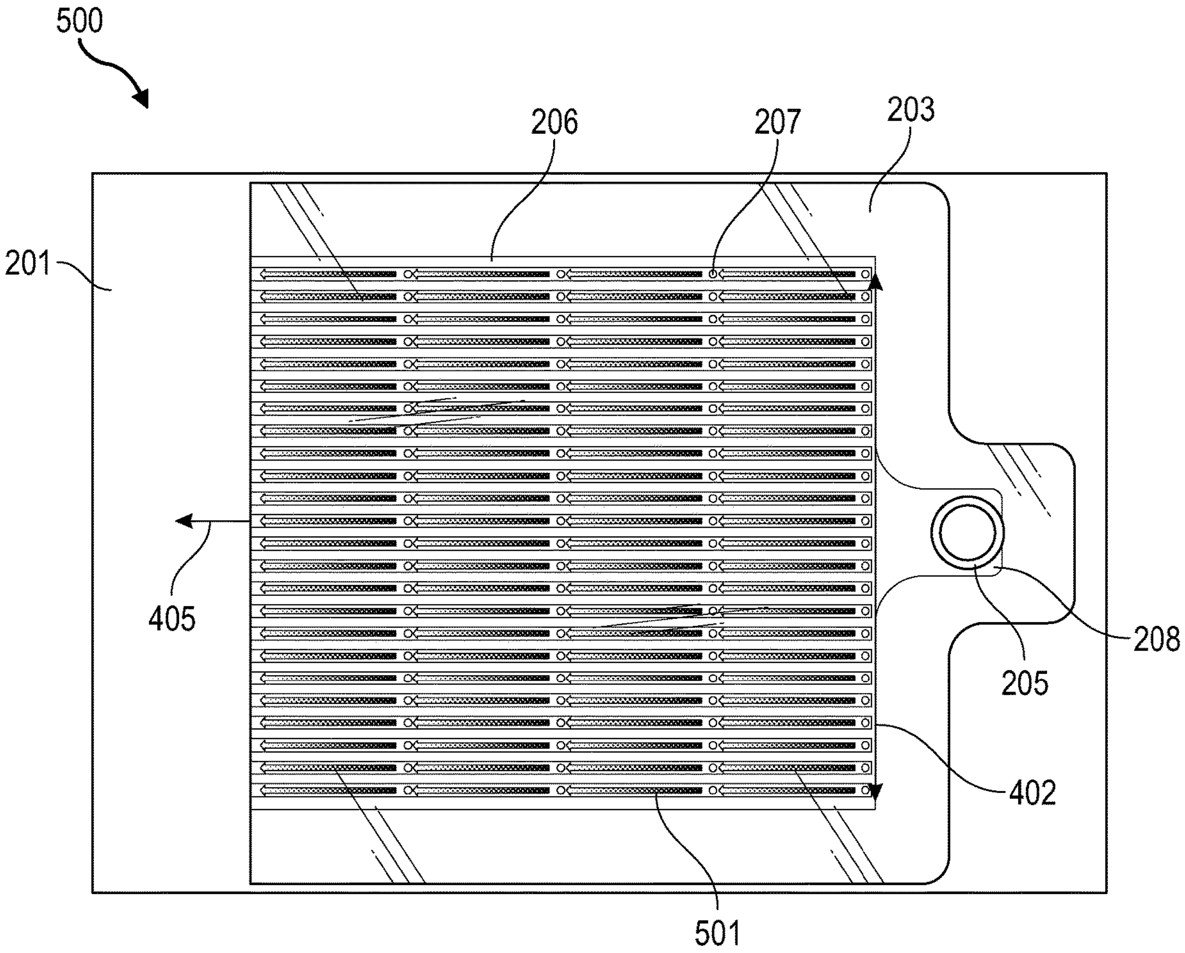
FIG. 5 is a diagram illustrating a top view of an example of an immersion cold plate with impingement, according to some embodiments.

FIG. 4 illustrates cross section view 400 and FIG. 5 top view 500 of an immersion cold plate with impingement. Particularly, view 400 shows fluid flow 401 into inlet 205 in the vertical direction, hitting inlet cover portion 208 disposed under inlet 205, and producing first horizontal fluid flow 402 in upper cavity 403 of cover 203. Both fluid flow 401 and first horizontal fluid flow 402 may include cooling liquid or oil before the heat exchange operation with fins 202.

As the cooling liquid or oil finds holes 207, impingement flow 404 occurs in the vertical direction at different locations of base 201 above channels between adjacent fins 202. This in turn produces second horizontal fluid flow 405 along fins 202 toward outlet 204. Second horizontal fluid flow 405 may include cooling liquid or oil after the heat exchange operation with fins 202, such that the temperature of second horizontal fluid flow 405 exiting the cold plate is greater than the temperature of first horizontal fluid flow 402.

Referring to top view 500, temperature/heat gradients 501 show local temperatures in different areas of base 201, to further illustrate how impingement plate 206 distributes flow, periodically provides fresh fluid to different portions of the cold plate and underlying IHS component and increases the heat transfer coefficient.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination thereof. Such configured devices are physically designed to perform the specified operation(s).

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs.

As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

The invention claimed is:

1. A cold plate, comprising:

a base having fins disposed in parallel;

a cover having a cavity configured to house the fins, wherein the cover is configured to allow a liquid to flow from an inlet to an outlet along the base and between the fins, wherein the outlet has a rectangular cross section, and wherein the fins are configured to extend at least across the rectangular cross section width; and an impingement plate disposed between the base and the cover.

2. The cold plate of claim 1, wherein the impingement plate is configured to distribute portions of the liquid from the inlet to different areas of the base before the portions of the liquid make any physical contact with any of the fins.

3. The cold plate of claim 1, wherein the impingement plate comprises holes configured to distribute the liquid among the fins.

4. The cold plate of claim 3, wherein the holes are disposed along rows perpendicular with respect to the fins.

5. The cold plate of claim 4, wherein along a given row, each of a plurality of holes is disposed between two adjacent fins.

6. The cold plate of claim 1, wherein the base is configured to be coupled to one or more Information Handling System (IHS) components.

7. The cold plate of claim 6, wherein the one or more IHS components comprise at least one of: a Central Processing Unit (CPU), a Graphical Processing Unit (GPU), an audio Digital Signal Processor (aDSP), a Neural Processing Unit (NPU), a Tensor Processing Unit (TSU), a Neural Network Processor (NNP), an Intelligence Processing Unit (IPU), an Image Signal Processor (ISP), or a Video Processing Unit (VPU).

8. The cold plate of claim 6, wherein at least one of: a spacing between fins, a width of each fin, and/or the height of each fin, are selected to increase a heat exchange operation adjacent to a hot spot of the one or more IHS components.

9. The cold plate of claim 6, wherein a density of holes on the impingement plate may be selected, at least in part, to increase a heat exchange operation adjacent to a hot spot of the one or more IHS components.

10. An Information Handling System (IHS), comprising:

a component; and a cold plate coupled to the component, the cold plate comprising:

a base having fins disposed in parallel;

a cover having a cavity configured to house the fins, wherein the cover comprises an inlet and an outlet, and wherein the cover is configured to allow a liquid to flow from the inlet to the outlet along the base and between the fins, wherein the outlet has a rectangular cross section, and wherein the fins are configured to extend at least across the rectangular cross section width; and an impingement plate disposed between the base and the cover, wherein the impingement plate comprises holes, and wherein a density of the holes on the impingement plate is selected, at least in part, to account for a hot spot of the component and to maximize heat exchange on a portion of the base adjacent to the hot spot.

11. The IHS of claim 10, wherein the impingement plate is configured to distribute portions of the liquid from the inlet to different areas of the base without the portions of the liquid making any physical contact with any of the fins.

12. The IHS of claim 10, wherein the impingement plate is configured to distribute the liquid among the fins, wherein the holes are disposed along rows perpendicular with respect to the fins, and wherein along a given row, each of a plurality of holes is disposed between two adjacent fins.

13. A method, comprising:

receiving an Information Handling System (IHS); and coupling a cold plate to the IHS, the cold plate comprising:

a base having fins disposed in parallel;

a cover having a cavity configured to house the fins, wherein the cover is configured to allow a liquid to flow from an inlet to an outlet along the base and between the fins; and an impingement plate disposed between the base and the cover, wherein the impingement plate comprises holes, and wherein a density of the holes on the impingement plate is selected, at least in part, to account for a hot spot of an IHS component and to maximize heat exchange on a portion of the base adjacent to the hot spot.

14. The method of claim 13, wherein the impingement plate is configured to distribute portions of the liquid from the inlet to different areas of the base without the portions of the liquid making any physical contact with any of the fins, wherein the holes are configured to distribute the liquid among the fins, wherein the holes are disposed along rows perpendicular with respect to the fins, and wherein along a given row, each of a plurality of holes is disposed between two adjacent fins, the method further comprising immersing at least a portion of the IHS and the cold plate in the liquid.

* * * * *